United States Patent [19]
Endo et al.

[11] Patent Number: 6,133,465
[45] Date of Patent: Oct. 17, 2000

[54] PATTERN FORMATION METHOD AND SURFACE TREATMENT AGENT

[75] Inventors: Masayuki Endo, Osaka; Hiromi Ohsaki, Niigata, both of Japan

[73] Assignees: Matsushita Electric Industrial Co., Ltd., Osaka; Shin-Etsu Chemical Co., Ltd., Tokyo, both of Japan

[21] Appl. No.: 08/951,001

[22] Filed: Oct. 15, 1997

[30] Foreign Application Priority Data

Oct. 16, 1996 [JP] Japan .................................. 8-273292
Jan. 23, 1997 [JP] Japan .................................. 9-010533

[51] Int. Cl.$^7$ ................................ C07F 7/08; C07F 7/18
[52] U.S. Cl. ........................................ 556/436; 556/437
[58] Field of Search ..................... 556/436, 437

[56] References Cited

U.S. PATENT DOCUMENTS

| | | | |
|---|---|---|---|
| 4,051,164 | 9/1977 | Kung et al. ............................. | 556/436 |
| 5,037,855 | 8/1991 | Sato ....................................... | 556/436 |
| 5,091,290 | 2/1992 | Rolfson ................................. | 430/327 |
| 5,312,717 | 5/1994 | Sachdev et al. ....................... | 430/313 |
| 5,391,913 | 2/1995 | Mino et al. ............................ | 257/632 |
| 5,702,767 | 12/1997 | Peterson et al. . | |

FOREIGN PATENT DOCUMENTS

| | | |
|---|---|---|
| 0278996 | 2/1987 | European Pat. Off. . |
| 0260977 | 9/1987 | European Pat. Off. . |
| 0 260 977 | 3/1988 | European Pat. Off. . |
| 0 291 670 | 11/1988 | European Pat. Off. . |
| 0446772 | 9/1991 | European Pat. Off. . |
| 0 515 212 | 11/1992 | European Pat. Off. . |
| 0 691 674 | 1/1996 | European Pat. Off. . |
| 0 757 290 | 2/1997 | European Pat. Off. . |
| 0757290 | 2/1997 | European Pat. Off. . |
| 0 837 369 | 4/1998 | European Pat. Off. . |
| 58-188132 | 2/1983 | Japan . |
| 6-350000 | 12/1994 | Japan . |
| 2 167 686 | 6/1986 | United Kingdom . |
| 96 15861 | 5/1996 | WIPO . |

OTHER PUBLICATIONS

Pinnavaia, et al.: "Trioreganosilicon Acetylacetonates. Enol Ether Isomerism and Stereochemical Lability" Journal of the American Chemical Society, vol. 92, No. 15, Jul. 29, 1990, pp. 4544–4550.

Purrington, et al.: "Selective Monofluorination of beta–Diketones" Journal of Organic Chemistry, vol. 52, 1987, pp. 4307–4310.

*Primary Examiner*—Paul F. Shaver
*Attorney, Agent, or Firm*—McDermott, Will & Emery

[57] ABSTRACT

A surface of a semiconductor substrate of silicon is supplied with 4-trimethylsiloxy-3-penten-2-one serving as a surface treatment agent. Thus, H in OH groups existing on the surface of the semiconductor substrate is substituted with $Si(CH_3)_3$ (i.e., a trimethylsilyl group), resulting in producing $CH_3COCH_2COCH_3$ (i.e., acetylacetone). Then, the surface of the semiconductor substrate is coated with a resist, exposed by using a desired mask, and subjected successively to PEB and development, thereby forming a resist pattern thereon. Since the surface of the semiconductor substrate is treated with 4-trimethylsiloxy-3-penten-2-one, the surface of the semiconductor substrate is made to be hydrophobic, so that the adhesion of the semiconductor substrate can be improved. As a result, the resultant resist pattern has a satisfactory shape free from peeling.

1 Claim, 11 Drawing Sheets

PATTERN FORMATION METHOD AND SURFACE TREATMENT AGENT

BACKGROUND OF THE INVENTION

The present invention relates to a pattern formation method for forming a resist pattern on a semiconductor substrate in a manufacturing process of a semiconductor device, and also to a surface treatment agent for use in the formation of the resist pattern.

In accordance with improved density and integration of a semiconductor device, there are increasing demands for finer processing techniques in these days.

As first means for attaining a fine processing in a lithography process, a technique for improving adhesion between a semiconductor substrate and a resist pattern has been proposed as disclosed in Japanese Laid-Open Patent Publication No. 58-188132.

As a first example of the conventional technique, a pattern formation method using a resist including, for example, a phenol type resin will now be described.

First, the surface of a semiconductor substrate of silicon is supplied with a surface treatment agent including a silane compound represented by a general formula $R^8SiX_{3-n}R^9{}_n$ (wherein n indicates 0, 1 or 2; X indicates halogen or —$OR^{10}$ (wherein $R^{10}$ indicates an alkyl group having 1 through 3 carbon atoms); $R^8$ indicates $CH_2=CH-$, $ZCH_2-$ (wherein Z indicates halogen) or a group including:

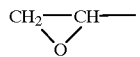

and $R^9$ indicates hydrogen or an alkyl group having 1 through 3 carbon atoms). Thus, the surface of the semiconductor substrate is made to be hydrophobic, thereby improving the adhesion of the semiconductor substrate.

Next, the resultant surface of the semiconductor substrate is coated with a resist including, for example, a phenol resin, so as to form a resist film. The resist film is exposed by using a desired mask, and then successively subjected to post-exposure bake (hereinafter referred to as the PEB) and development. In this manner, a resist pattern is formed.

As second means for attaining the fine processing in the lithography process, a technique for forming a resist pattern out of a chemically amplified resist utilizing generation of an acid by using, as exposing light, DUV light emitted by an excimer laser as a light source or light with a short wavelength such as EB and X-rays has recently been developed.

Now, the pattern formation method using the chemically amplified resist will be described as a second example of the conventional technique, referring to FIGS. 8, 9(a) and 9(b).

FIG. 8 shows a process flow of procedures in the pattern formation method described as the second example of the conventional technique, and FIGS. 9(a) and 9(b) illustrate the state of a surface of a semiconductor substrate obtained by this pattern formation method.

First, a surface of a semiconductor substrate 1 of silicon is supplied with hexamethyldisilazane (hereinafter referred to as HMDS) serving as a surface treatment agent, thereby making the surface of the semiconductor substrate 1 hydrophobic. Thus, the adhesion of the semiconductor substrate 1 is improved. This process is carried out by bubbling HMDS in a liquid phase with a nitrogen gas and spraying the resultant HMDS for 30 seconds onto the surface of the semiconductor substrate 1 having been heated up to 60° C. as is shown in FIG. 9(a). As a result, H in OH groups existing on the surface of the semiconductor substrate 1 is substituted with $Si(CH_3)_3$ (i.e., a trimethylsilyl group), thereby making the surface of the semiconductor substrate 1 hydrophobic. Thus, the adhesion of the semiconductor substrate 1 is improved as well as $NH_3$ (ammonia) is generated.

Next, the surface of the semiconductor substrate 1 is coated with a chemically amplified resist so as to form a resist film. The resist film is exposed by using a desired mask, and is then subjected successively to the PEB and the development. Thus, a resist pattern is formed.

In the resist pattern formed on the semiconductor substrate by the pattern formation method described as the first conventional example, the surface of the semiconductor substrate is treated with the aforementioned surface treatment agent, and hence, the adhesion between the semiconductor substrate and the resist pattern is improved. However, in the case where a further fine process is to be conducted in the lithography process, this adhesion is not sufficient. In other words, pattern peeling can be caused, for example, in the formation of a pattern of 0.30 µm or less by using i-line exposure, the formation of a pattern of 0.25 µm or less by using KrF excimer laser exposure, and the formation of a pattern of 0.20 µm or less by using ArF excimer laser exposure.

FIG. 10 is a schematic sectional view of a resist pattern 2 formed on the semiconductor substrate 1 of silicon by the pattern formation method described as the second example of the conventional technique. Specifically, the surface of the semiconductor substrate 1 of silicon is coated with a positive type chemically amplified resist (manufactured by Japan Synthetic Rubber Co., Ltd.; KRF K2G) in a thickness of 0.7 µm, the resultant resist film is exposed with a KrF excimer laser stepper with NA of 0.5 and subjected to the PEB for 90 seconds at a temperature of 100° C., and the resultant is developed by using a 2.38 wt % aqueous solution of tetramethylammonium hydroxide. The thus obtained line and space pattern of 0.25 µm has the sectional shape as is shown in FIG. 10.

In the second example of the conventional technique, an insoluble skin layer 3 is formed on the surface of the resist pattern 2 as is shown in FIG. 10. The insoluble skin layer 3 is formed on the resist pattern 2 owing to different atmospheres in the pattern formation.

The insoluble skin layer 3 on the surface of the resist pattern 2 can harmfully affect subsequent processes, which can disadvantageously decrease a yield of the semiconductor device.

SUMMARY OF THE INVENTION

In view of the aforementioned conventional problems, the object of the invention is further improving the adhesion between a semiconductor substrate and a resist pattern as well as preventing an insoluble skin layer from being formed on the surface of a resist pattern in using a chemically amplified resist.

As a result of various studies, the present inventors have found that the surface adhesion of a resist pattern can be improved by treating the surface of a semiconductor substrate with a surface treatment agent including a silane compound represented by the following General Formula 1:

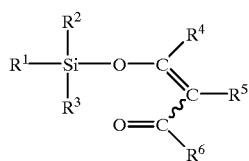

(1)

wherein $R^1$, $R^2$ and $R^3$ are the same or different groups selected from the group consisting of a hydrogen atom, a substituent or non-substituted saturated hydrocarbon group having 1 through 6 carbon atoms, a substituent or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, $OR^7$, (wherein $R^7$ is a hydrogen atom, a substituent or non-substituted saturated hydrocarbon group having 1 through 6 carbon atoms, a substituent or non-substituted unsaturated hydrocarbon group having 1 through 6 carbon atoms, or an alicyclic saturated hydrocarbon group having 3 through 6 carbon atoms), a substituent or non-substituted saturated hydrocarbon group having 1 through 6 carbon atoms, a substituent or non-substituted unsaturated hydrocarbon group having 1 through 6 carbon atoms, and an alicyclic saturated hydrocarbon group having 3 through 6 carbon atoms.

Specifically, in the silane compound represented by General Formula 1, the energy level of the electrophilic orbital is so low that a trimethylsilyl group included in the silane compound is highly reactive to a OH group existing on the substrate. Accordingly, a silicon atom included in the aforementioned silane compound having a carbonyl group can very rapidly react to a silanol group, that is, a compound having an active hydrogen atom.

Therefore, the silane compound represented by General Formula 1 reacts to a silanol group existing on the surface of the semiconductor substrate very rapidly, resulting in making the surface of the semiconductor substrate to be hydrophobic with ease.

In order to prove that the rate of the reaction between the silane compound represented by General Formula 1 and a silanol group is higher than the rate of the reaction between conventionally used hexamethyldisilazane and a silanol group, the following experiments were carried out: 4-trimethylsiloxy-3-penten-2-one, used as an example of the silane compound represented by General Formula 1, was mixed with 0.5 equivalent of cyclohexanol, so as to measure the rate of this reaction. The obtained reaction rate was as high as 100% in 1 hour. In contrast, HMDS was also mixed with 0.5 equivalent of cyclohexanol, so as to similarly measure the rate of the reaction. The obtained reaction rate was 43.9% in 24 hours.

Also, the present inventors have made various studies on the cause of the formation of an insoluble skin layer on the surface of a resist pattern, resulting in finding that the formation is due to an alkali component. Specifically, when an alkali component exists on the surface of a resist pattern, an acid generated through the exposure is deactivated, thereby forming an insoluble skin layer on the resist pattern. As a result, the surface of the resist pattern is formed into a T-top shape. This is understandable also in consideration of a report that a pattern cannot be resolved when a large amount of an alkali component is included (S. A. MacDonald, et al., Proc. SPIE, Vol. 1466, p. 2 (1991)).

In order to examine the cause of generation of an ammonia component, that is, an alkali component harmfully affecting a chemically amplified resist, impurities in an atmosphere were analyzed in a clean room. As a result, the concentration of trimethylsilanol, that is, a decomposition of HMDS, and that of ammonia in the atmosphere were found to be positively correlative with each other as is shown in FIG. 11. Based on this result, an alkali component harmfully affecting the shape of a pattern of a chemically amplified resist can be estimated to be generated from HMDS conventionally used as the surface treatment agent for the semiconductor substrate.

The present invention was devised on the basis of the aforementioned findings. According to the invention, a surface treatment agent including the silane compound represented by General Formula 1 is used instead of the conventionally used HMDS, so that the adhesion between a semiconductor substrate and a resist pattern can be improved. In addition, since this silane compound is used, the formation of an insoluble skin layer on the surface of a resist pattern is avoided in using a chemically amplified resist because an alkali component can be prevented from being generated on the surface of the semiconductor substrate.

Specifically, the pattern formation method of this invention comprises a first step of treating a surface of a semiconductor substrate with a surface treatment agent including a silane compound represented by the following General Formula 1:

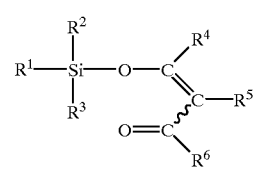

(1)

wherein $R^1$, $R^2$ and $R^3$ are the same or different groups selected from the group consisting of a hydrogen atom, a substituent or non-substituted saturated hydrocarbon group having 1 through 6 carbon atoms, a substituent or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, $OR^7$, (wherein $R^7$ is a hydrogen atom, a substituent or non-substituted saturated hydrocarbon group having 1 through 6 carbon atoms, a substituent or non-substituted unsaturated hydrocarbon group having 1 through 6 carbon atoms, or an alicyclic saturated hydrocarbon group having −3 through 6 carbon atoms), a substituent or non-substituted saturated hydrocarbon group having 1 through 6 carbon atoms, a substituent or non-substituted unsaturated hydrocarbon group having 1 through 6 carbon atoms, and an alicyclic saturated hydrocarbon group having 3 through 6 carbon atoms; a second step of forming a resist film by coating, with a resist, the surface of the semiconductor substrate having been surface-treated; and a third step of forming a resist pattern through exposure of the resist film by using a mask with a desired pattern shape and development.

According to the pattern formation method of this invention, the semiconductor substrate is surface-treated with the surface treatment agent including the silane compound represented by General Formula 1, and hence, the hydrophobic property of the surface of the semiconductor substrate can be improved, resulting in improving the adhesion between the semiconductor substrate and a resist pattern formed thereon. In other words, the energy level of the electrophilic orbital of the silane compound is so low that a trimethylsilyl group included in the silane compound is highly reactive to a silanol group included in the semiconductor substrate. Therefore, a large number of silyl groups in the silane compound are adhered to the surface of the semiconductor substrate, resulting in making the surface of the semiconductor substrate to be hydrophobic. Thus, the adhesion between the semiconductor substrate and a resist pattern thereon can be largely improved, resulting in forming a satisfactory resist pattern free from peeling.

In the pattern formation method of this invention, when the resist coated in the second step is a chemically amplified resist including an acid generator and a resin that is changed to be alkali-soluble by a function of an acid, a chemically amplified resist including an acid generator, an alkali-soluble resin and a compound or resin that is changed to be alkali-soluble by a function of an acid or a chemically amplified resist including an acid generator, an alkali-soluble resin and a compound or resin that is crosslinked by a function of an acid, no alkali component is generated on the surface of the semiconductor substrate through the surface treatment because the semiconductor substrate has been surface-treated with the surface treatment agent including the silane compound represented by General Formula 1. Therefore, an acid generated from the chemically amplified resist through the exposure can be prevented from reacting to an alkali component, and hence, a resist pattern in a stable shape free from an insoluble skin layer on the surface thereof can be formed.

Furthermore, in the conventional technique, while the semiconductor substrate is allowed to stand between the exposure and the PEB, an acid generated in the chemically amplified resist through the exposure is deactivated due to an alkali component generated through the surface treatment using the conventional surface treatment agent, such as HMDS, generating an alkali component. As a result, an insoluble skin layer is disadvantageously formed on the surface of the obtained resist pattern. However, according to the pattern formation method of this invention, no alkali component exists on the surface of the chemically amplified resist while the semiconductor substrate is allowed to stand between the exposure and the PEB. Therefore, an acid generated in the chemically amplified resist through the exposure cannot be deactivated, resulting in forming a resist pattern in a further stable shape free from an insoluble skin layer thereon.

Furthermore, in the pattern formation method of this invention, the resist coated in the second step can include a naphthoquinone diazido compound and a novolak resin. Also in this case, the adhesion between the semiconductor substrate and the obtained resist pattern can be improved.

The surface treatment agent of this invention comprises a silane compound represented by the following General Formula 1:

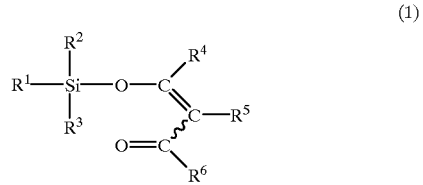

(1)

wherein $R^1$, $R^2$ and $R^3$ are the same or different groups selected from the group consisting of a hydrogen atom, a substituent or non-substituted saturated hydrocarbon group having 1 through 6 carbon atoms, a substituent or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, $OR^7$, (wherein $R^7$ is a hydrogen atom, a substituent or non-substituted saturated hydrocarbon group having 1 through 6 carbon atoms, a substituent or non-substituted unsaturated hydrocarbon group having 1 through 6 carbon atoms, or an alicyclic saturated hydrocarbon group having 3 through 6 carbon atoms), a substituent or non-substituted saturated hydrocarbon group having 1 through 6 carbon atoms, a substituent or non-substituted unsaturated hydrocarbon group having 1 through 6 carbon atoms, and an alicyclic saturated hydrocarbon group having 3 through 6 carbon atoms.

When the surface of the semiconductor substrate is treated with the surface treatment agent including the silane compound represented by General Formula 1, the hydrophobic property of the surface of the semiconductor substrate can be improved, resulting in improving the adhesion between the semiconductor substrate and a resist pattern formed thereon. Accordingly, in using both a chemically amplified resist and any other resist, a satisfactory resist pattern free from peeling can be formed. In particular, when a chemically amplified resist is used, an acid generated from the chemically amplified resist through the exposure can be definitely prevented from being deactivated, and hence, a resist pattern in a good shape can be formed.

DETAILED DESCRIPTION OF THE INVENTION

Embodiment 1

A pattern formation method according to a first embodiment of the invention will now be described with reference to FIGS. 1, 2(a), 2(b) and 3.

Figure 1:
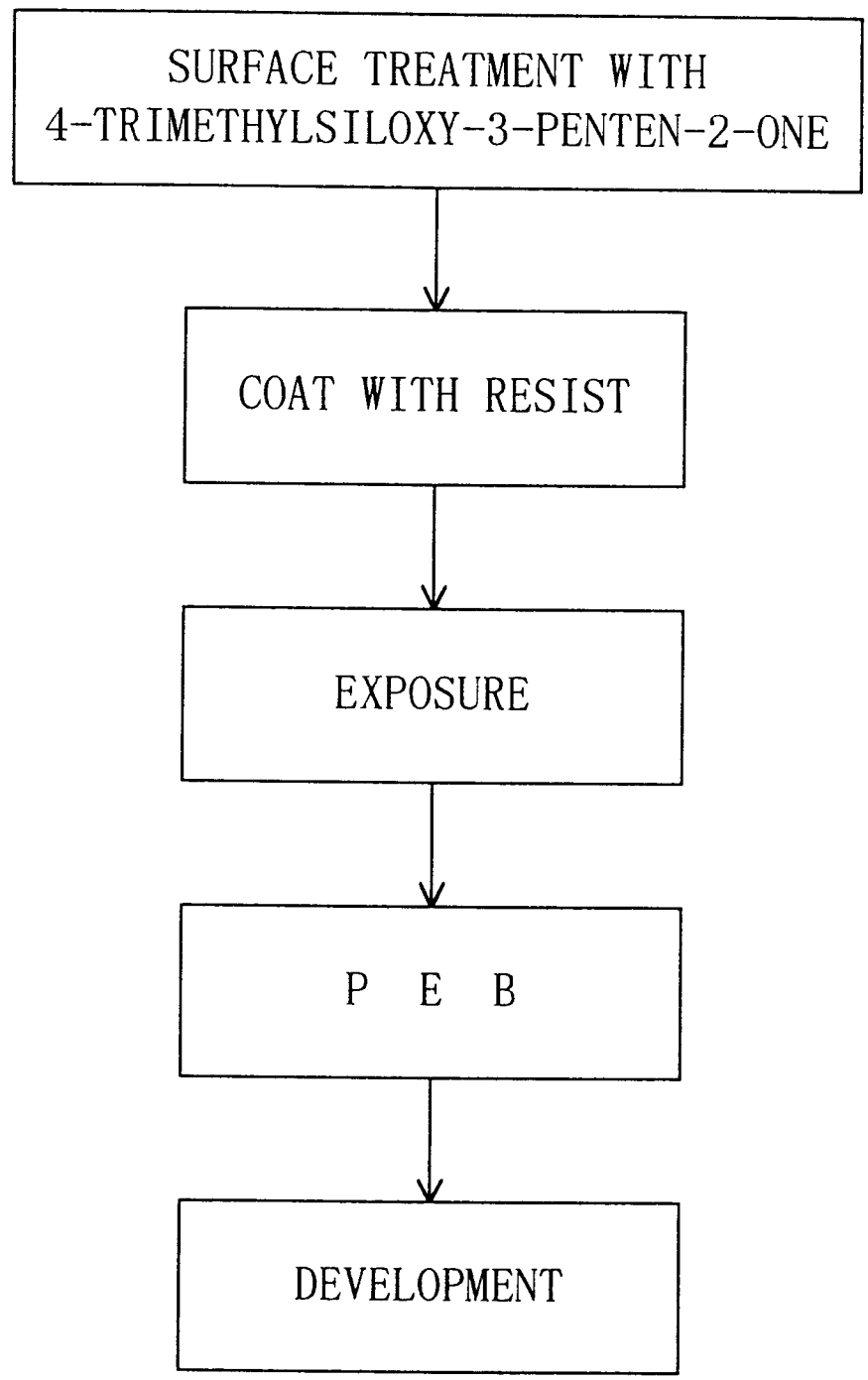
FIG. 1 is a flowchart for showing procedures in a pattern formation method according to a first embodiment of the invention.
Figure 2A:
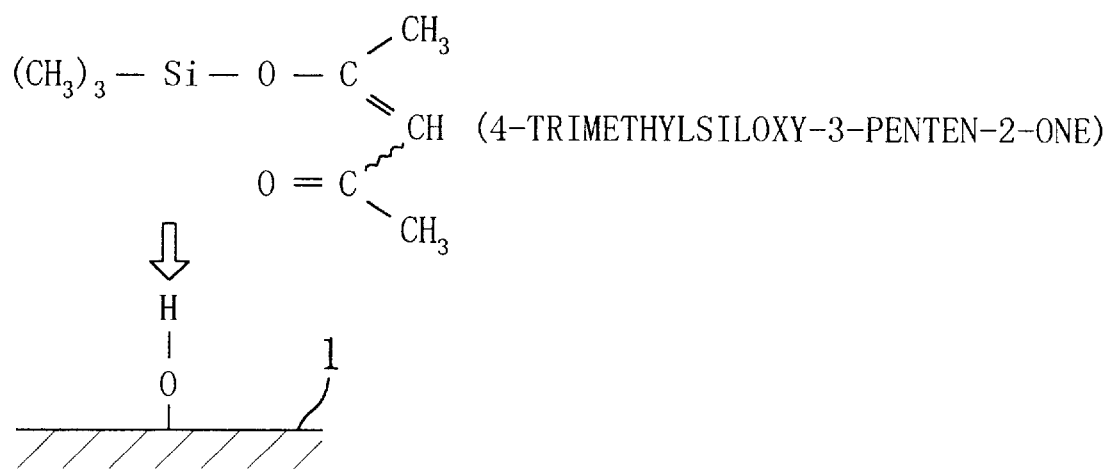
FIGS. 2(a) and 2(b) are schematic diagrams for showing the state of a surface of a semiconductor substrate obtained by supplying 4-trimethylsiloxy-3-penten-2-one in the pattern formation method of the first embodiment.
Figure 2B:
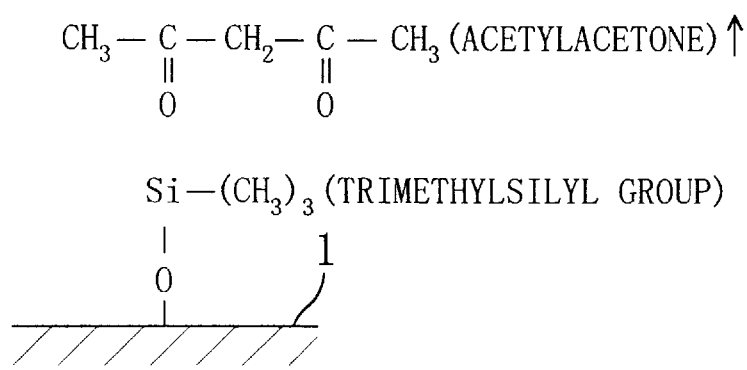
Figure 3:
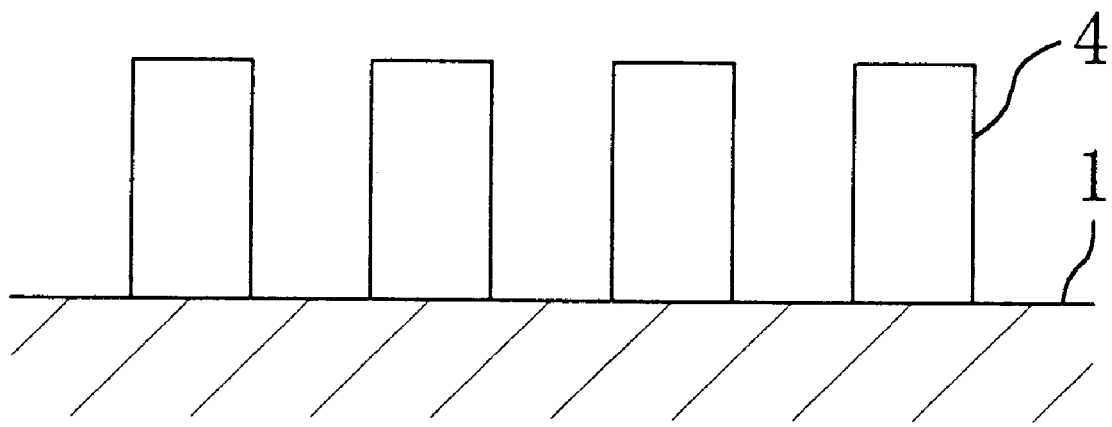
FIG. 3 is a schematic diagram for showing a sectional shape of a resist pattern formed by the pattern formation method of the first embodiment.

FIG. 1 shows a process flow of the pattern formation method according to the first or second embodiment of the invention, FIGS. 2(a) and 2(b) show the state of a surface of a semiconductor substrate resulting from a surface treatment by using a surface treatment agent of the first or second embodiment, and FIG. 3 shows a schematic sectional shape of a resist pattern formed on the semiconductor substrate whose surface has been treated by the surface treatment agent of the first embodiment.

First, as is shown in FIG. 2(a), the surface of a semiconductor substrate 1 of silicon is supplied with 4-trimethylsiloxy-3-penten-2-one, serving as the surface treatment agent and represented as:

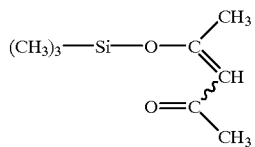

Specifically, 4-trimethylsiloxy-3-penten-2-one is bubbled with a nitrogen gas and then sprayed for 30 seconds onto the surface of the semiconductor substrate 1 having been heated up to 90° C. Thus, the surface of the semiconductor substrate 1 is made to be hydrophobic, thereby improving the adhesion of the semiconductor substrate 1. In this manner, H in OH groups existing on the surface of the semiconductor substrate 1 is substituted with $Si(CH_3)_3$ (i.e., a trimethylsilyl group), resulting in producing $CH_3COCH_2COCH_3$ (acetylacetone) as is shown in FIG. 2(b).

Next, the resultant surface of the semiconductor substrate 1 is coated with a resist, exposed by using a desired mask, and then subjected successively to the PEB and the development, thereby forming a resist pattern.

As a result of the pattern formation in the aforementioned manner, a resist pattern 4 with a satisfactory shape free from peeling is formed on the semiconductor substrate 1 as is shown in FIG. 3. Specifically, the semiconductor substrate 1 is coated with a positive type resist (manufactured by Sumitomo Chemical Co., Ltd.; PFI-38) in a thickness of 1.0 μm, exposed by using an i-line stepper with NA of 0.6, subjected to the PEB for 90 seconds at a temperature of 100° C., and developed by using a 2.38 wt % aqueous solution of tetramethylammonium hydroxide. FIG. 3 shows the sectional shape of the thus formed resist pattern 4 of 0.30 μm line and space.

In this manner, since 4-trimethylsiloxy-3-penten-2-one is used as the surface treatment agent in the first embodiment, the adhesion of the semiconductor substrate can be improved, resulting in forming the resist pattern 4 having a satisfactory shape free from peeling.

In this embodiment, the adhesion between the semiconductor substrate 1 and the resist pattern 4 depends upon the hydrophobic property of the semiconductor substrate 1 which has been surface-treated. Therefore, the type of the resist for forming the resist pattern 4 is not particularly specified, and any of the following resists is widely applicable: A resist mainly including a naphthoquinone diazido compound and a novolak resin; a two-component system chemically amplified positive resist including an acid generator and a resin that is changed to be alkali-soluble by a function of an acid; a three-component system chemically amplified positive resist including an acid generator, an alkali-soluble resin and a compound or resin that is changed to be alkali-soluble by a function of an acid; and a chemically amplified negative resist including an acid generator, an alkali-soluble resin and a compound or resin that is crosslinked by a function of an acid.

Embodiment 2

Figure 4:
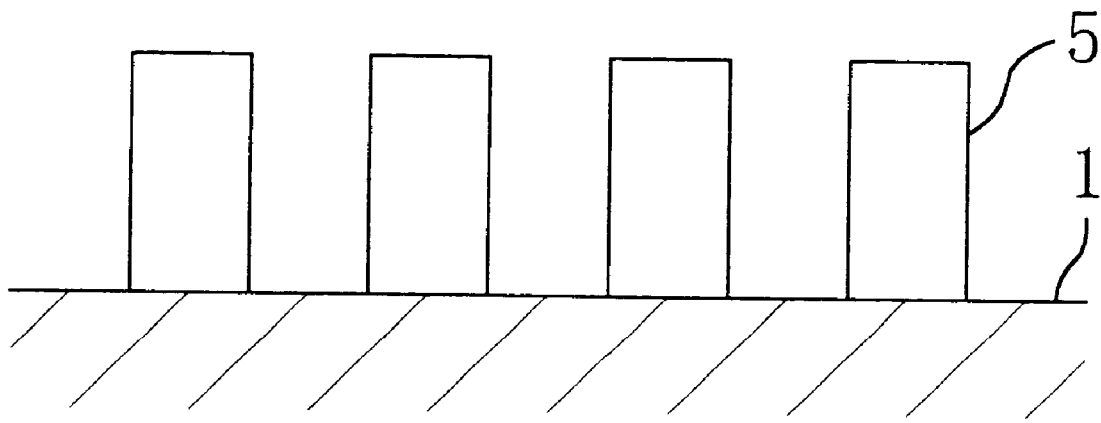
FIG. 4 is a schematic diagram for showing a sectional shape of a resist pattern formed by a pattern formation method according to a second embodiment of the invention.

A pattern formation method according to the second embodiment of the invention will now be described with reference to FIGS. 1, 2(a), 2(b) and 4. FIG. 4 shows a schematic sectional shape of a resist pattern formed on a semiconductor substrate whose surface has been treated with a surface treatment agent of the second embodiment.

First, as is shown in FIG. 2(a), the surface of a semiconductor substrate 1 of silicon is supplied with 4-trimethylsiloxy-3-penten-2-one, serving as the surface treatment agent and represented as:

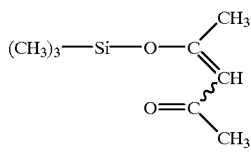

Specifically, 4-trimethylsiloxy-3-penten-2-one is bubbled with a nitrogen gas, and then sprayed for 30 seconds onto the surface of the semiconductor substrate having been heated up to 90° C. Thus, the surface of the semiconductor substrate 1 is made to be hydrophobic, thereby improving the adhesion of the semiconductor substrate 1. In this manner, H in OH groups existing on the surface of the semiconductor substrate 1 is substituted with $Si(CH_3)_3$ (i.e., a trimethylsilyl group), resulting in producing $CH_3COCH_2COCH_3$ (acetylacetone).

Next, the resultant surface of the semiconductor substrate 1 is coated with a chemically amplified resist, exposed by using a desired mask, and then subjected successively to the PEB and the development, thereby forming a resist pattern.

When a pattern 5 is thus formed, no insoluble skin layer is formed on the surface of the resist pattern 5 as is shown in FIG. 4. Specifically, the semiconductor substrate 1 is coated with a chemically amplified positive resist (manufactured by Japan Synthetic Rubber Co., Ltd.; KRF K2G) in a thickness of 0.7 μm, exposed by using a KrF excimer laser stepper with NA of 0.5, subjected to the PEB for 90 seconds at a temperature of 100° C., and developed by using a 2.38 wt % aqueous solution of tetramethylammonium hydroxide. FIG. 3 shows the sectional shape of the thus formed resist pattern 5 of 0.25 μm line and space.

In this manner, since 4-trimethylsiloxy-3-penten-2-one is used as the surface treatment agent in the second embodiment, the surface of the semiconductor substrate 1 can be made to be hydrophobic without producing ammonia. Therefore, an insoluble skin layer is prevented from being formed on the resist pattern 5, resulting in forming the resist pattern 5 in the stable shape.

Embodiment 3

A pattern formation method according to a third embodiment of the invention will now be described with reference to FIGS. 5, 6(*a*), 6(*b*) and 7.

Figure 5:
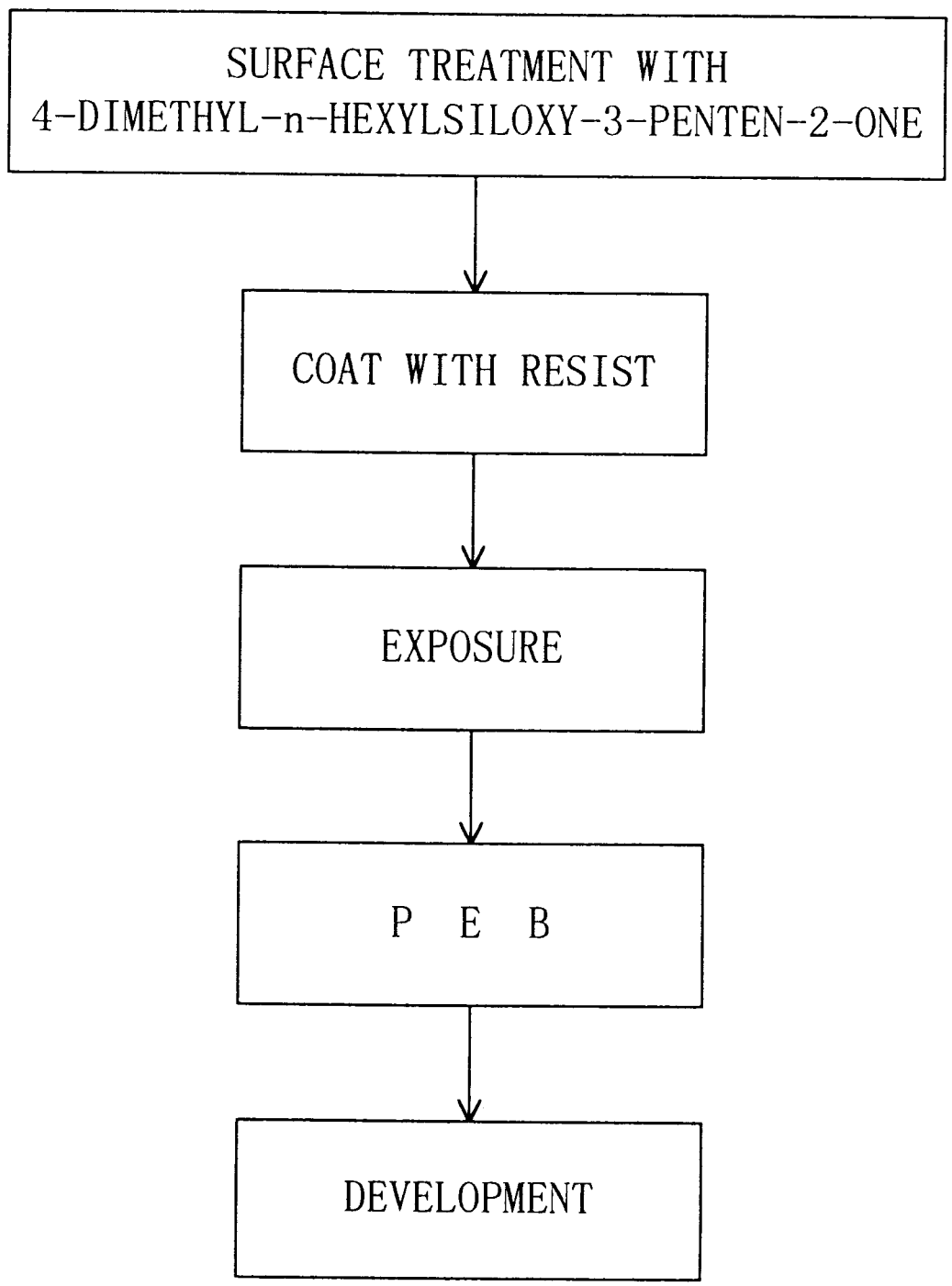
FIG. 5 is a flowchart for showing procedures in a pattern formation method according to a third embodiment of the invention.
Figure 6:
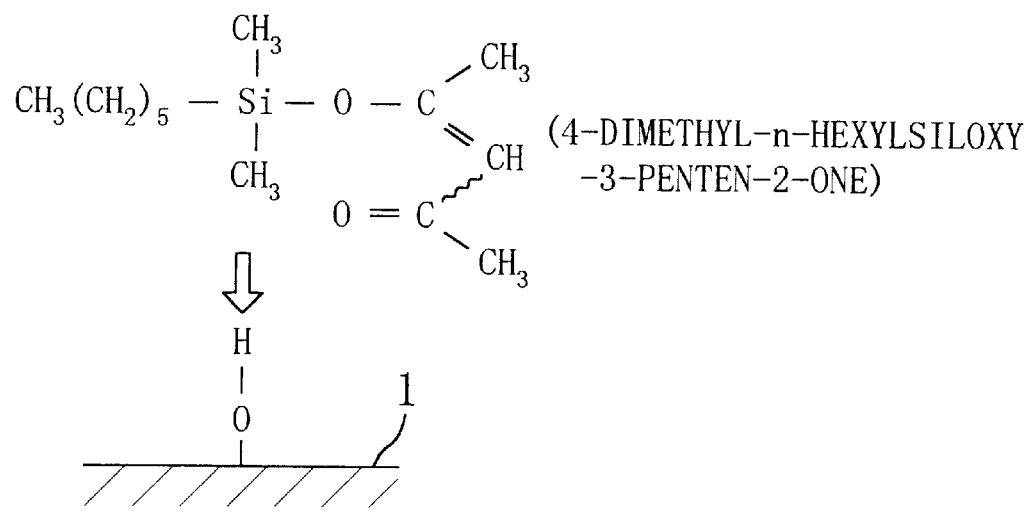
FIGS. 6(a) and 6(b) are schematic diagrams for showing the state of a semiconductor substrate obtained by supplying 4-dimethyl-n-hexylsiloxy-3-penten-2-one in the pattern formation method of the third embodiment.
Figure 6:
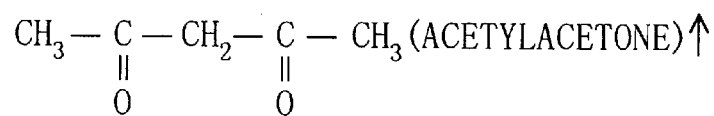
Figure 6:
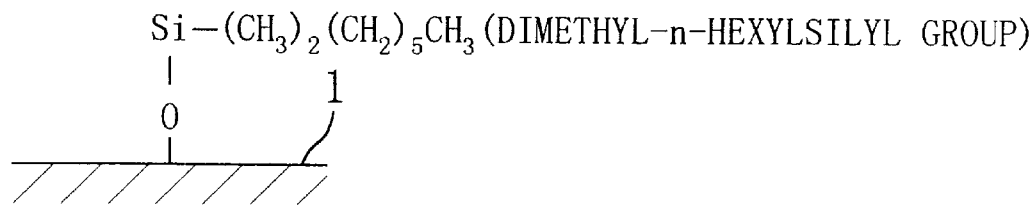
Figure 7:
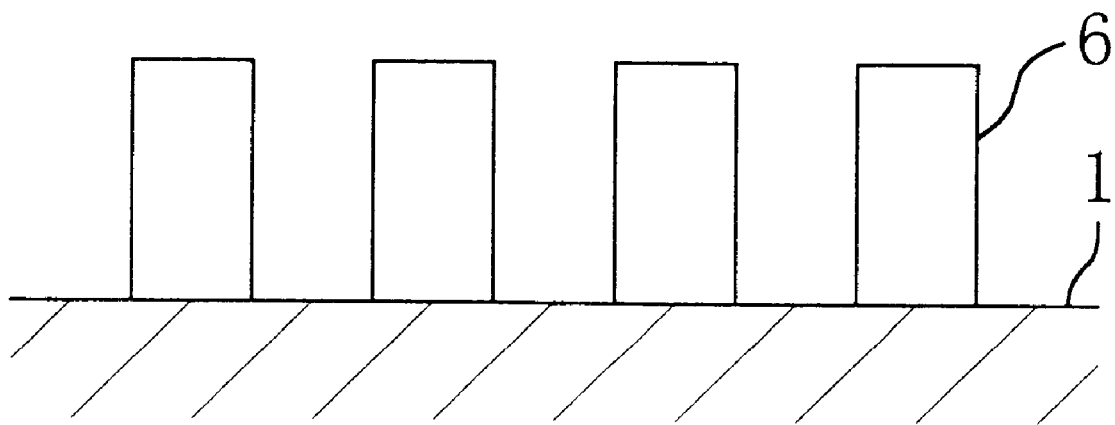
FIG. 7 is a schematic diagram for showing a sectional shape of a resist pattern formed by the pattern formation method of the third embodiment.
Figure 8:
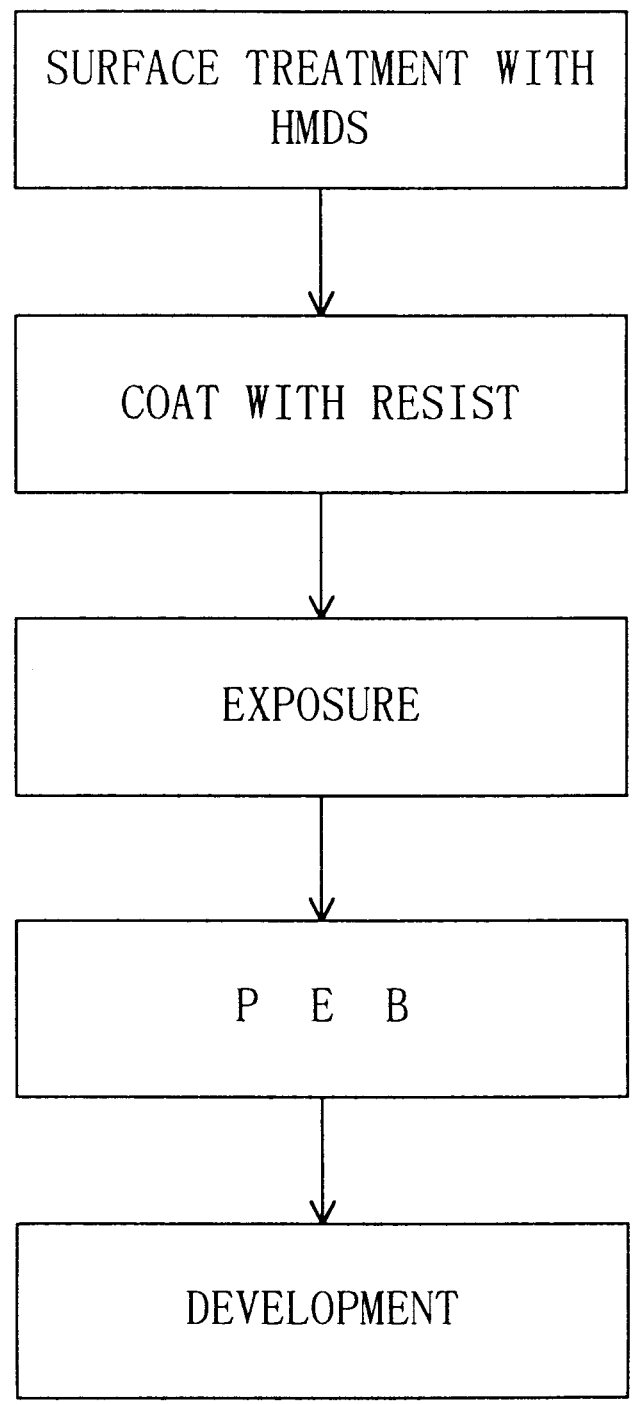
FIG. 8 is a flowchart for showing procedures in a pattern formation method described as a second example of conventional technique.
Figure 9A:
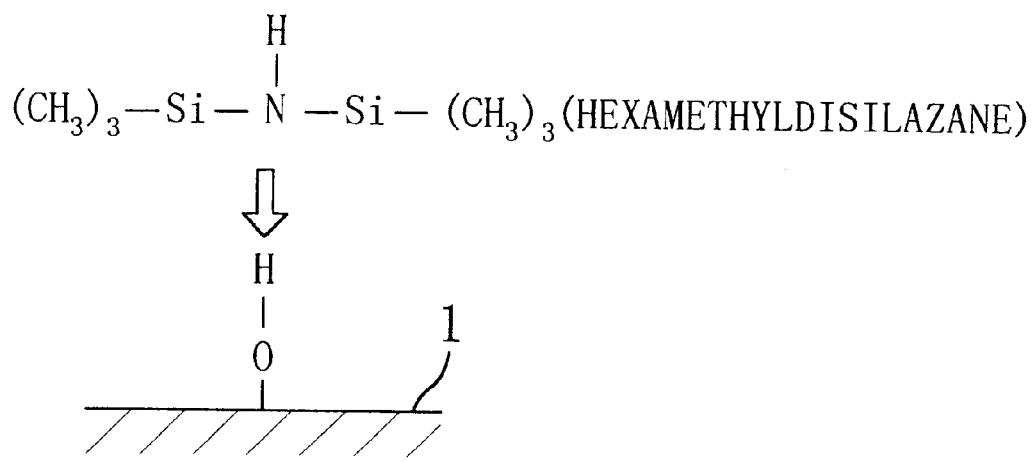
FIGS. 9(a) and 9(b) are schematic diagrams for showing the state of a semiconductor substrate obtained by supplying HMDS in the pattern formation method of the second example of the conventional technique.
Figure 9B:
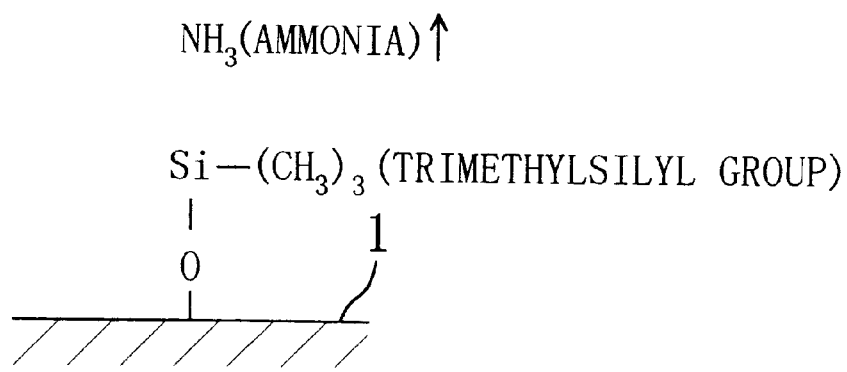
Figure 10:
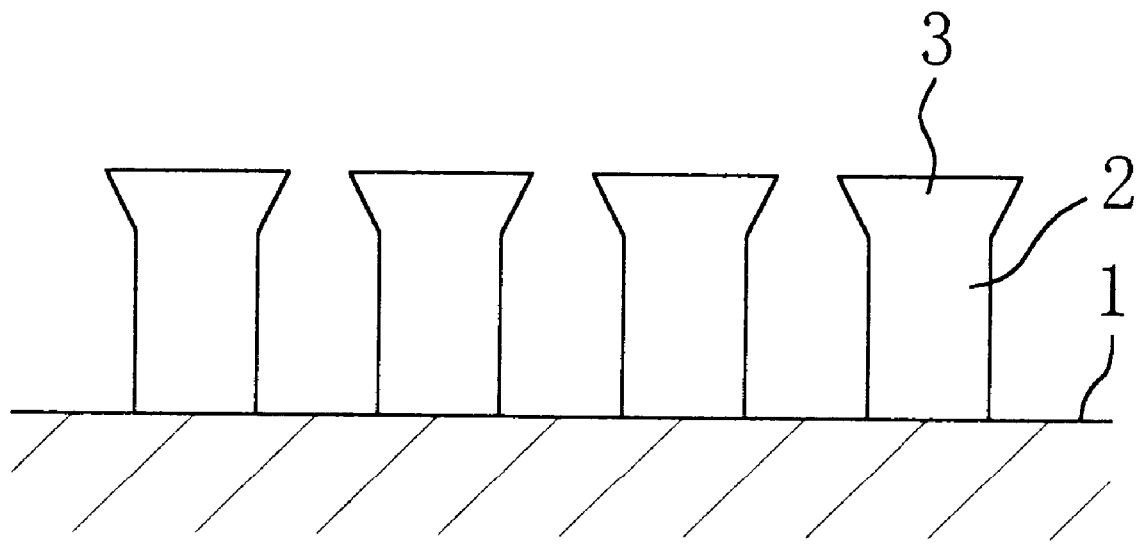
FIG. 10 is a schematic diagram for showing a sectional shape of a resist pattern formed by the pattern formation method of the second example of the conventional technique.
Figure 11:
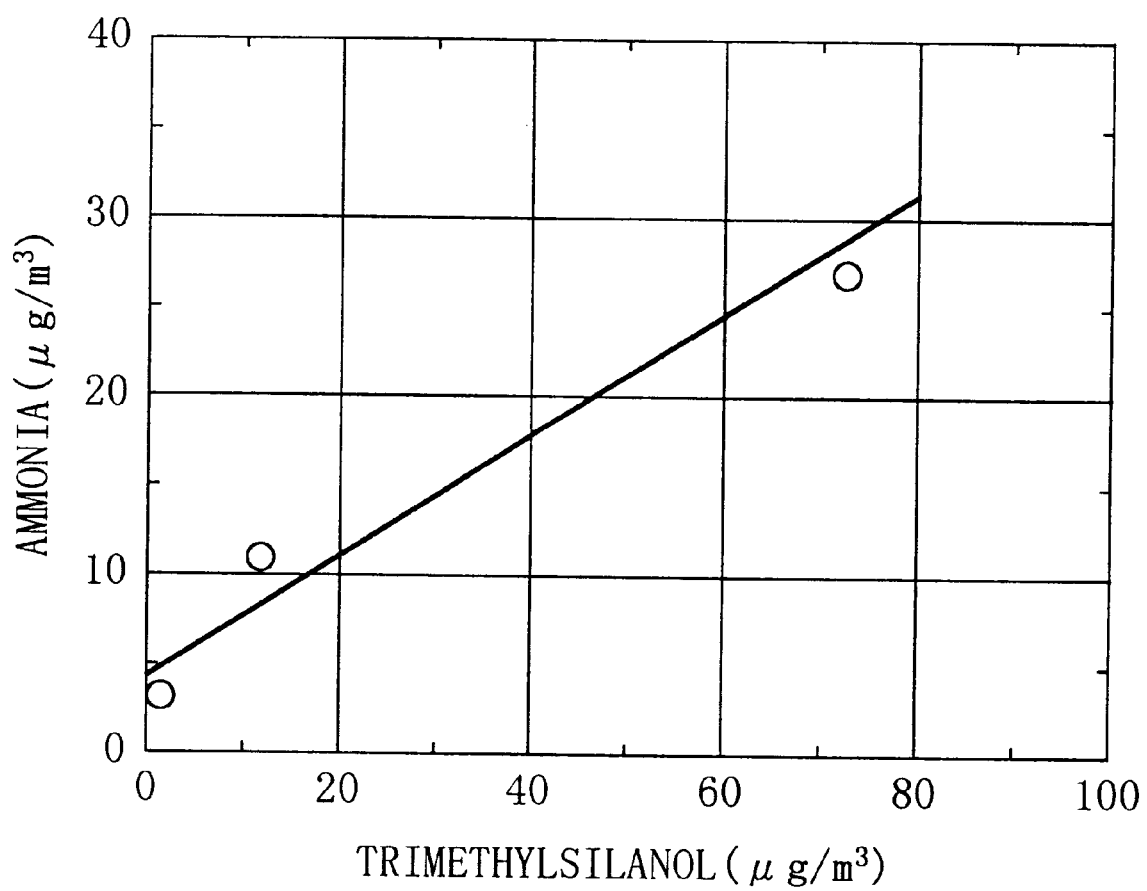
FIG. 11 is a graph for showing the correlation between a concentration of trimethylsilanol, that is, a decomposition of HMDS, and a concentration of ammonia in the atmosphere.

FIG. 5 shows a process flow of the pattern formation method of the third embodiment, FIGS. 6(*a*) and 6(*b*) illustrate the state of a surface of a semiconductor substrate resulting from a surface treatment by using a surface treatment agent of the third embodiment, and FIG. 7 shows a schematic sectional shape of a pattern formed on the semiconductor substrate whose surface has been treated with the surface treatment agent of the third embodiment.

First, as is shown in FIG. 6(*a*), the surface of a semiconductor substrate 1 is supplied with 4-dimethyl-n-hexylsiloxy-3-penten-2-one, serving as the surface treatment agent and represented as:

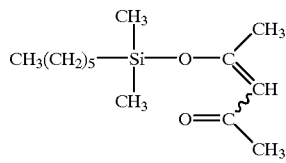

Specifically, 4-dimethyl-n-hexylsiloxy-3-penten-2-one is bubbled with a nitrogen gas and then sprayed for 30 seconds onto the surface of the semiconductor substrate 1 having been heated up to 90° C. Thus, the surface of the semiconductor substrate 1 is made to be hydrophobic, thereby improving the adhesion of the semiconductor substrate 1. In this manner, H in OH groups existing on the surface of the semiconductor substrate 1 is substituted with $Si(CH_3)_2$ $(CH_2)_5CH_3$ (i.e., a dimethyl-n-hexylsilyl group), resulting in producing $CH_3COCH_2COCH_3$ (acetylacetone) as is shown in FIG. 6(*b*).

Next, the semiconductor substrate 1 is coated with a chemically amplified resist, exposed by using a desired mask, and then subjected successively to the PEB and the development, thereby forming a resist pattern.

When a pattern 6 is thus formed, no insoluble skin layer is formed on the surface of the resist pattern 6 as is shown in FIG. 7. Specifically, the semiconductor substrate 1 is coated with a chemically amplified positive resist (manufactured by Japan Synthetic Rubber Co., Ltd.; KRF K2G) in a thickness of 0.7 μm, exposed by using a KrF excimer laser stepper with NA of 0.5, subjected to the PEB for 90 seconds at a temperature of 100° C., and developed by using a 2.38 wt % aqueous solution of tetramethylammonium hydroxide. FIG. 7 shows the sectional shape of the thus formed resist pattern 6 of 0.25 μm line and space.

In this manner, since 4-dimethyl-n-hexylsiloxy-3-penten-2-one is used as the surface treatment agent in this embodiment, the surface of the semiconductor substrate 1 can be made to be hydrophobic without producing ammonia. Therefore, an insoluble skin layer can be prevented from being formed on the surface of the resist pattern, resulting in forming the resist pattern in the stable shape.

As the surface treatment agent, 4-trimethylsiloxy-3-penten-2-one is used in the first and second embodiments, and 4-dimethyl-n-hexylsiloxy-3-penten-2-one is used in the third embodiment, but the surface treatment agent of the invention is not limited to those described in the respective embodiments. Specifically, it is possible to use any surface treatment agent including a silane compound represented by the following General Formula 1:

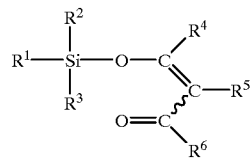

(1)

wherein $R^1$, $R^2$ and $R^3$ are the same or different groups selected from the group consisting of a hydrogen atom, a substituent or non-substituted saturated hydrocarbon group having 1 through 6 carbon atoms, a substituent or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, $OR^7$, (wherein $R^7$ is a hydrogen atom, a substituent or non-substituted saturated hydrocarbon group having 1 through 6 carbon atoms, a substituent or non-substituted unsaturated hydrocarbon group having 1 through 6 carbon atoms, or an alicyclic saturated hydrocarbon group having 3 through 6 carbon atoms), a substituent or non-substituted saturated hydrocarbon group having 1 through 6 carbon atoms, a substituent or non-substituted unsaturated hydrocarbon group having 1 through 6 carbon atoms, and an alicyclic saturated hydrocarbon group having 3 through 6 carbon atoms.

Other examples of the silane compound represented by General Formula 1 include the following compounds represented by Chemical Formulas 1 through 3:

Chemical Formula 1:

(a)

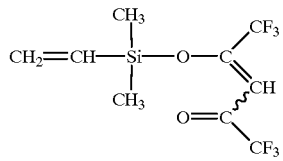

(b)

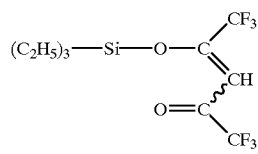

(c)

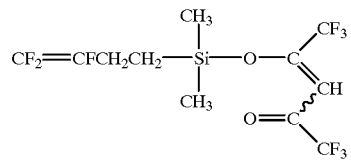

(d)

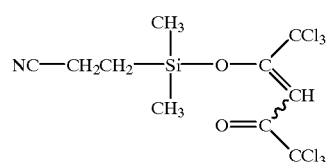

Chemical Formula 2:

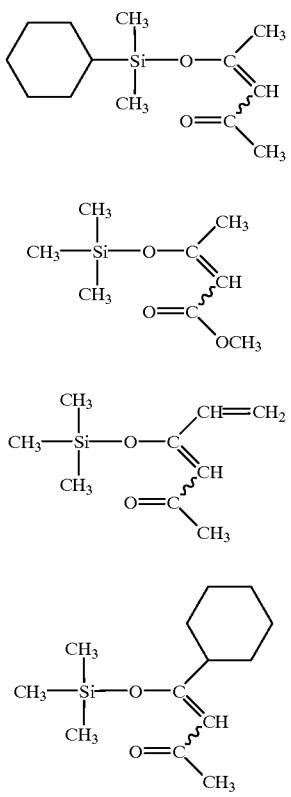

Chemical Formula 3:

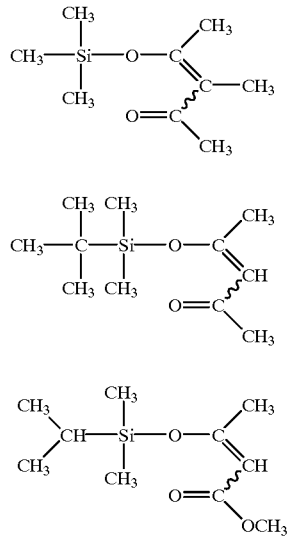

In Chemical Formulas 1 through 3, (a) indicates 3-dimethylvinylsiloxytrifluoromethyl-2-propen-1-trifluoromethyl-1-one; (b) indicates 3-triethylsiloxytrifluoromethyl-2-propen-1-trifluoromethyl-1-one; (c) indicates 3-dimethyl(3',4',4'-trifluoro-3'-butenyl)siloxytrifluoromethyl-2-propen-1-trifluoromethyl-1-one; (d) indicates 3-dimethyl(2'-cyanoethyl)siloxytrichloromethyl-2-propen-1-trichloromethyl-1-one; (e) indicates 4-dimethylcyclohexylsiloxy-3-penten-2-one; (f) indicates 2-trimethylsiloxy-1-methoxycarbonyl-1-propene; (g) indicates 4-trimethylsiloxy-3,5-hexadien-2-one; (h) indicates 4-trimethylsiloxy-4-cyclohexyl-3-buten-2-one; (i) indicates 4-trimethylsiloxy-3-methyl-3-penten-2-one; (j) indicates 4-t-butyldimethylsiloxy-3-penten-2-one; and (k) indicates 2-isopropyldimethylsiloxy-1-methoxycarbonyl-1-propene.

When the surface of a semiconductor substrate is treated with the surface treatment agent including the silane compound represented by General Formula 1, the surface of the semiconductor substrate is made to be hydrophobic, resulting in improving the adhesion between the semiconductor substrate and a resist pattern formed thereon.

Also, since no alkali component is generated on the surface of the semiconductor substrate through the surface treatment, an acid generated through the exposure from the chemically amplified resist can be prevented from reacting with an alkali component. Therefore, a resist pattern in a stable shape having no insoluble skin layer on its surface can be formed by using the chemically amplified resist.

When at least one of $R^1$, $R^2$ and $R^3$ has 3 or more carbon atoms in General Formula 1, a gap of a hydrocarbon layer is formed between the resist and an atom having a lone pair on the surface of the semiconductor substrate during the surface treatment. Accordingly, the hydrophobic property of the surface of the semiconductor substrate is further improved.

Owing to such improvement of the hydrophobic property of the semiconductor substrate and the hydrocarbon layer formed on the semiconductor substrate, when the chemically amplified resist is used, the acid generated from the resist hardly reacts to the lone pair on the surface of the semiconductor substrate. As a result, deactivation of the acid generated from the chemically amplified resist can be avoided, so as to prevent the formation of footing of the resist pattern. Examples of the applicable semiconductor substrate include a BPSG film, a TiN film, a SiN film and the like.

In the second and third embodiments, the two-component system chemically amplified positive resist (KRF K2G) including an acid generator and a resin that is changed to be alkali-soluble by a function of an acid is used as the chemically amplified resist. However, the applicable resist is not particularly herein specified, and any of the following resists is widely applicable: A three-component system chemically amplified positive resist including an acid generator, an alkali-soluble resin and a compound or resin that is changed to be alkali-soluble by a function of an acid; and a three-component system chemically amplified negative resist including an acid generator, an alkali-soluble resin and a compound or resin that is crosslinked by a function of an acid. An example of a commercially available two-component system chemically amplified positive resist includes TDUR-DP007 manufactured by Tokyo Ohka Kogyo Co., Ltd., examples of a commercially available three-component system chemically amplified positive resist include DX561 and DX981 manufactured by Hoechst Japan Ltd., and examples of a commercially available three-component system chemically amplified negative resist include XP-8843 and SAL-601 manufactured by Shipley Company.

Furthermore, since the chemically amplified resist is affected by an alkali component regardless of its composition or components, the second and third embodiments are applicable to not only all types of chemically amplified resists but also chemically amplified resists applicable to all types of exposing light (including KrF, ArF, DUV, EUV, X-rays, EB, etc.).

Examples of the components of the chemically amplified resists will now be described, and it is noted that these exemplified components do not limit the invention.

<Two-component System Chemically Amplified Positive Resist>

Resin that is changed to be alkali-soluble by a function of an acid:

poly(t-butoxycarbonyloxystyrene-co-hydroxystyrene)

poly(t-butoxycarbonylmethyloxystyrene-co-hydroxystyrene)

poly(tetrahydropyranyloxystyrene-co-hydroxystyrene)

poly (2-methyl-2-adamantylmethacrylate-co-3-oxocyclohexylmethacrylate)

Acid generator:

Onium salt, nitrobenzyl sulfonate

<Three-component System Chemically Amplified Positive Resist>

Alkali-soluble resin:

polyvinylphenol, polymethacrylic acid

Resin or compound that is changed to be alkali-soluble by a function of an acid:

poly(t-butoxycarbonyloxystyrene-co-hydroxystyrene)

poly(t-butoxycarbonylmethyloxystyrene-co-hydroxystyrene)

poly(tetrahydropyranyloxystyrene-co-hydroxystyrene)

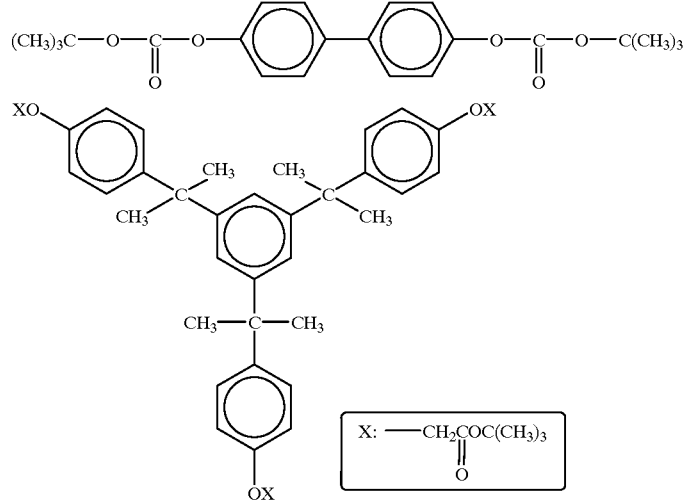

Acid generator:

Onium salt, nitrobenzyl sulfonate

<Three-component System Chemically Amplified Negative Resist>

Alkali-soluble resin:

polyvinylphenol, polymethacrylic acid

Compound or resin that is crosslinked by a function of an acid:

melamine compound, melamine resin

Acid generator:

Onium salt, nitrobenzyl sulfonate

When experiments are made in the same manner as described in the first through third embodiments by using the silane compounds represented by Chemical Formulas 1 through 3, the results are satisfactory as listed in Tables 1 through 3 below:

TABLE 1

| COMPOUND | PEELING IN 0.3 $\mu$m LINE AND SPACE PATTERN | INSOLUBLE SKIN LAYER IN 0.25 $\mu$m LINE AND SPACE PATTERN |
|---|---|---|
| $CH_2{=}CH{-}Si(CH_3)_2{-}O{-}C(CF_3)({=}CH{-}C({=}O){-}CF_3)$ | NONE | NONE |
| $(C_2H_5)_3{-}Si{-}O{-}C(CF_3)({=}CH{-}C({=}O){-}CF_3)$ | NONE | NONE |

TABLE 1-continued

| COMPOUND | PEELING IN 0.3 $\mu$m LINE AND SPACE PATTERN | INSOLUBLE SKIN LAYER IN 0.25 $\mu$m LINE AND SPACE PATTERN |
|---|---|---|
| $CF_2{=}CFCH_2CH_2{-}Si(CH_3)_2{-}O{-}C(CF_3)({=}CH{-}C({=}O){-}CF_3)$ | NONE | NONE |

TABLE 1-continued

| COMPOUND | PEELING IN 0.3 μm LINE AND SPACE PATTERN | INSOLUBLE SKIN LAYER IN 0.25 μm LINE AND SPACE PATTERN |
|---|---|---|
| 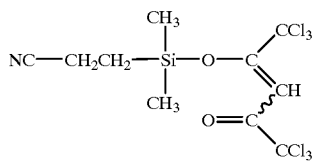 | NONE | NONE |

TABLE 2

| COMPOUND | PEELING IN 0.3 μm LINE AND SPACE PATTERN | INSOLUBLE SKIN LAYER IN 0.25 μm LINE AND SPACE PATTERN |
|---|---|---|
| 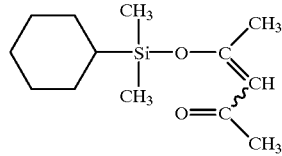 | NONE | NONE |
| 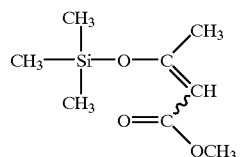 | NONE | NONE |
| 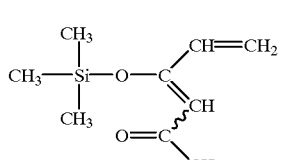 | NONE | NONE |
| 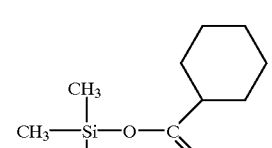 | NONE | NONE |

TABLE 3

| COMPOUND | PEELING IN 0.3 μm LINE AND SPACE PATTERN | INSOLUBLE SKIN LAYER IN 0.25 μm LINE AND SPACE PATTERN |
|---|---|---|
| 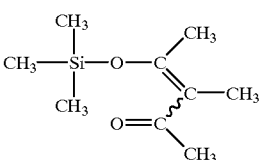 | NONE | NONE |
| 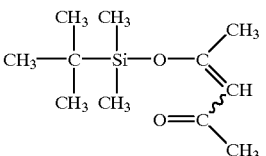 | NONE | NONE |
| 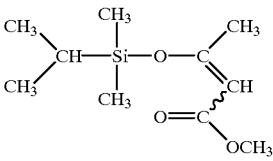 | NONE | NONE |

What is claimed is:

1. A surface treatment agent comprising a silane compound represented by the following General Formula 1:

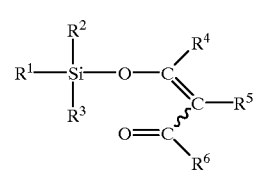

(1)

wherein:

R$^1$, R$^2$, and R$^3$ are the same or different groups selected from the group consisting of a hydrogen atom, a substituent or non-substituted saturated hydrocarbon group having 1 through 6 carbon atoms, a substituent or non-substituted unsaturated hydrocarbon group having 1 through 6 carbon atoms, and an alicyclic saturated hydrocarbon group having 3 through 6 carbon atoms;

wherein when each of R$^1$, R$^2$, and R$^3$ is the same group and is a substituted or non-substituted saturated hydrocarbon group, or a substituted or non-substituted unsaturated hydrocarbon group, wherein R$^1$, R$^2$, and R$^3$ is either a substituted or non-substituted saturated hydrocarbon group having 2 through 6 carbons, or a substituted or non-substituted unsaturated hydrocarbon group having 2 through 6 carbons; and R$^4$, R$^5$, and R$^6$ are the same or different groups selected from the group consisting of a hydrogen atom, OR$^7$, (wherein R$^7$ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms), a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms.

* * * * *